May 13, 1958 L. L. BURNS, JR., ET AL 2,834,878

CONTROLLABLE REACTANCE SYSTEMS

Filed July 27, 1955

INVENTORS

LESLIE L. BURNS, JR. &

BY EUGENE O. KEIZER

ATTORNEY

United States Patent Office 2,834,878

Patented May 13, 1958

2,834,878

CONTROLLABLE REACTANCE SYSTEMS

Leslie L. Burns, Jr. and Eugene O. Keizer, Princeton, N. J., assignors to Radio Corporation of America, a corporation of Delaware Application July 27, 1955, Serial No. 524,707

The terminal 15 years of the term of the patent to be granted has been disclaimed 1 Claim. (Cl. 250—20)

The present invention relates to improvements in electrical circuits capable of providing a controllable variable reactance and, more particularly, to simplified and inexpensive circuit means employing a semi-conductor amplifier device for producing electrical capacitance or electrical inductance, the value of which may be controlled by varying the effective power gain of the semi-conductor amplifier device.

In electrical circuits such as radio receivers, television receivers and signal processing circuits in general, it is often times desirable to provide means for varying the effective electrical reactance appearing at various points in the circuit as a function of electrical control potential. For example, it may be desirable to manually or automatically control the frequency of an oscillator, the value of a time constant network or the frequency response of a filter network as a function of a control potential whereby the operation of the overall circuit is stabilized or altered in some desired manner.

It is an object of the present invention to provide a simple and economical variable reactance circuit for providing a controllable value of electrical capacitance or inductance as a function of an electrical control potential.

It is further an object of the present invention to provide a simple and inexpensive variable capacitance circuit which will allow an especially large variation in the electrically expressed capacitance in response to an electrical control signal.

It is still another object of the present invention to provide an improved electrically controllable variable capacitance circuit employing a semi-conductor amplifier.

In one of its more general forms the present invention takes the form of a series combination of resistance and reactance means (either inductive or capacitive in character) which is connected across the circuit terminals it is desired to provide with a variable reactance. The base emitter input circuit of a semi-conductor amplifier is then connected across the reactance means and the resistance means is connected in turn through suitable collector-emitter biasing potential means to the collector of the amplifier. Signal power delivered by the amplifier then develops a signal across the resistance means which is of the same electrical sense as that appearing across the reactance whereby to reduce the effect of the reactance component in the combination. Means are then provided for varying the gain of the amplifier circuit so that a controllable value of reactance is expressed across the combination.

Figure 1:
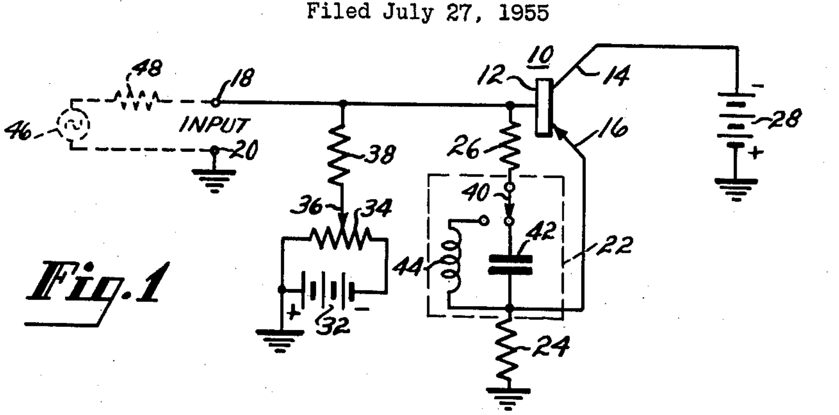
Figure 2:
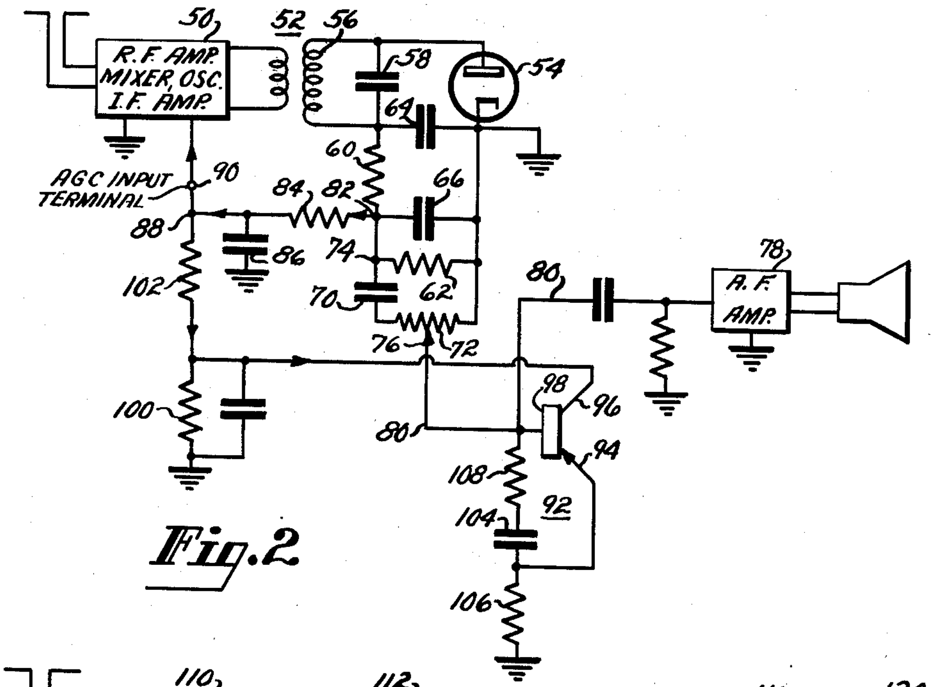
Figure 3:
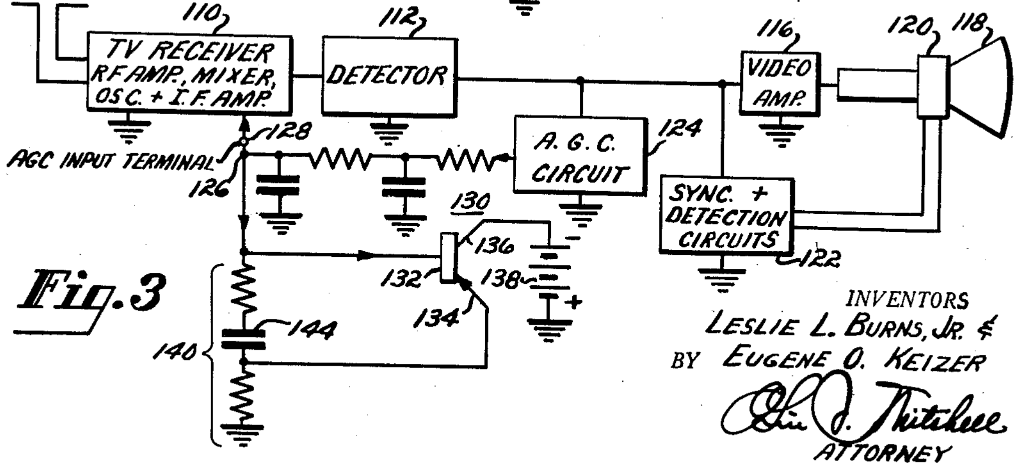

A better understanding of the present invention as well as other of its objects and features of advantage will be obtained through a reading of the following description especially when taken in connection with the accompanying drawings in which:

Fig. 1 is a schematic representation of one form of variable reactance device provided by the present invention;

Fig. 2 is a combination block and schematic diagram of a radio receiver circuit embodying a variable capacitance device in accordance with the present invention to provide improved operating characteristics under low signal-to-noise ratio conditions; and Fig. 3 is a combination block and schematic diagram of the more conventional elements of a television receiving system and including a variable capacitance means in accordance with the present invention to provide a desired alteration in the time constant of the AGC circuit as a function of signal strength.

Turning now in detail to Fig. 1, there is shown at 10 a schematic representation of a semi-conductor amplifier which by way of example may be of the transistor variety having a base electrode 12, collector electrode 14 and emitter electrode 16. It will be assumed it is desired to produce a controllable variable reactance either capacitive or inductive in nature across input terminals 18 and 20. In accordance with the present invention, a reactance means such as an inductor or capacitor, indicated in the dotted line box 22, is connected in series with a resistor 24 across the input terminals 18 and 20. Terminal 20 is indicated as being at circuit ground potential as is also the lower extremity of resistor 24. The base-emitter input circuit of the transistor 10 is connected in shunt across the reactance means 22 through a compensating resistor 26. The use of compensating resistor 26 is optional. A source of collector-emitter biasing potential 28 is connected between the collector 14 and the lower extremity of resistor 24 through the medium of circuit ground. The polarity of the potential source 28 will be determined by the character of the transistor 10. Assuming the transistor to be of PNP variety the polarity of the potential source 28 would be as shown in Fig. 1 to obtain power amplification from the transistor 10.

In further accordance with the present invention, means are provided for controlling the overall gain in the circuit. In the arrangement of Fig. 1, this is accomplished by varying the value of static current flow constituting the input bias current flow between the emitter 16 and base 12. Potential source 32 is connected across potentiometer 34 whose arm 36 is connected with the base 12 through resistor 38. The positive potential extremity of potentiometer 34 is established at circuit ground. In accordance with the present invention, the reactance means 22 referred to above may be either capacitive or inductive in nature. Switch 40 within block 22 has been provided so that either capacitor 42 or inductor 44 may be presented across the terminals of the reactance means 22.

In explaining the operation of the embodiment of the invention shown in Fig. 1, it will be assumed that an alternating voltage is applied to the terminals 18 and 20. A source of alternating current potential 46 having an internal resistance 48, is connected with the terminals 18 and 20. With the switch 40 in the position shown, the circuit illustrated in Fig. 1 will act as a variable capacitance means. Signal voltage will appear between the base 12 and circuit ground. The capacitor 42 will, therefore, charge and discharge in accordance with the alternating current waveform applied across it. As potential of the base 12 changes, output current from the amplifier 10 will produce a voltage drop across the resistor 24 which will tend to change the lower extremity of the capacitor 42 in the same direction as the potential change of the base 12. The alternating current excursion of the lower plate of capacitor 42 may be made to be substantially as great as the alternating current excursion of the upper plate of the capacitor 42 depending upon the gain of the amplifier circuit. Under such conditions, the circuit will act as though capacitor 42 were of very small value or theoretically zero. As the gain of the amplifier circuit is reduced the lower terminal of capacitor 42 will be established at a fixed D.-C. potential relative to circuit ground and except for a passive alternating current drop across resistor 24, alternating current excursions will appear only at the base 12 and the upper terminal of capacitor 42. Under these conditions the effect of capacitor 42 will be maximized.

In accordance with the present invention the arm 36 of the potentiometer 34 may be moved to and fro along the potentiometer resistance element to adjust the input circuit bias of the transistor 10 and consequently control the overall gain of the amplifier circuit. As the arm 36 is moved toward the negative extremity of the potentiometer resistance element, the forwarded emitter base bias current will tend to increase consequently increasing the gain of the transistor amplifier circuit and reducing the effective value of the capacitor 42. Likewise, the arm 36 may be moved toward the positive extremity of the potentiometer 34 with the result that the gain of the amplifier will be decreased and the effective value of capacitor 42 will appear greater.

Switch 40 may be positioned to connect the inductor 44 in series with resistor 24. The above-described action with respect to the capacitor 42 will be applicable to the inductor 44 to result in a variable inductance type circuit.

It will be apparent from the circuit arrangement of Fig. 1 that the larger the value of resistor 24 the greater the gain of the amplifying circuit will be and the more closely the effective value of reactance expressed between terminals 18 and 20 may be made to approximate zero. However, as the value of resistance in series with the reactance means is increased, the power factor of the impedance presented at terminals 18 and 20 is increased. For example, considering the arrangement of Fig. 1 wherein capacitor 42 is connected in series with resistors 26 and 24 across the terminals 18 and 20, it will be seen that unless the reactance value of capacitor 42 at a given frequency is much higher than the sum of ohmic values of resistors 24 and 26, the alternating current impedance between terminals 18 and 20 will be largely resistive. This resistive component results in a current flow which leads the implied voltage by considerably less than the theoretical 90° (zero power factor) which characterizes a theoretically perfect capacitive reactance. As the frequency of the alternating current signal appearing between terminals 18 and 20 is reduced, the reactance of the capacitor 42 will increase such that the values of resistors 24 and 26 become very small compared to the reactance value of the capacitor. At extremely low frequencies the reactance of capacitor 42 will be sufficiently great compared to the ohmic value of resistors 24 and 26 taken in summation that the impedance appearing between terminals 18 and 20 be predominately capacitive in character. Thus, the ohmic sum of resistors 24 and 26 become significant only at high frequencies when using the capacitor 42 and only at low frequencies when employing the inductor 44. Furthermore, it will be seen that at higher signal frequencies, the reactive voltage drop across capacitor 42 will tend to become less so that the input signal to the transistor amplifier device will drop with frequency. Conversely, when the inductor 24 is employed, the input signal to the transistor attributable to reactance voltage drop will decrease with frequency. Consequently, it may be desirable in some cases to employ an additional resistor 26 in series with the reactance element 22 whether it be capacitive or inductive.

The effective bandwidth over which the variable reactance is useful, may be maximized by making resistor 26 as large as possible in the light of the lowest power factor which must be realized. In practice, it has been found that good operating results are obtained if the value of resistor 26 is not less than $\frac{1}{50}$ of the value of resistor 24 whereas the value of resistor 24 should not be more than five times or less than $\frac{1}{20}$ the value of the base-emitter input resistance to the transistor. With the value of resistor 24 at 1000 ohms, resistor 26 at 100 ohms, capacitor 42 at .1 mfd., the value of resistor 38 at 43,800 ohms and utilizing a 2N34 transistor (PNP), a ten to one change in the capacitance expressed across terminals 18 and 20 may easily be realized by controlling the base-emitter biasing current of the transistor 10.

The embodiment of the invention shown in Fig. 2 concerns the application of the present invention to controlling the audio frequency response of a standard sound radio receiver. At low signal strength it is desirable to reduce the high frequency response of the receiver to minimize the annoyance of reproduced noise interference. In block 50, there is indicated a standard RF amplifier superheterodyne mixer, oscillator, and intermediate frequency amplifier. Output signal from the last intermediate frequency amplifier is coupled via transformer 52 to a diode demodulator circuit utilizing the diode 54. The secondary winding 56 of the transformer is tuned by capacitor 58 to the intermediate signal frequency. The diode demodulator load circuit comprises a resistor 60, resistor 62 and capacitors 64, 66 and 70. The resistance value of volume control potentiometer 72 is generally sufficiently high that it provides little loading on the demodulator circuit. Demodulated output signal appearing at terminal 74 is capacitively coupled via capacitor 70 to the potentiometer 72 such that the arm 76 may be adjustably positioned for volume control purposes. Signals at the arm 76 are directly connected with the input of the audio frequency amplifier 78 via circuit path 80.

The average D.-C. potential at terminal 82 in Fig. 2 according to conventional circuit operation, will vary with the intensity of received signal strength whereby a filter network comprising elements 84 and 86 may be employed to develop at terminal 88 an automatic gain control potential suitable for application to the automatic gain control input terminal 90. As the received signal becomes greater in intensity, the potential of terminal 90 will become more negative tending to reduce the gain of one or more R. F. amplifiers and one or more I. F. amplifiers in block 50.

In accordance with the present invention, the effective capacity from arm 76 of the volume control potentiometer 72 to circuit ground in Fig. 2 (and hence the effective capacity in shunt with the audio amplifier 78) is caused to increase as the received signal becomes less in intensity. Increasing the capacity to circuit ground at the arm 76 will reduce the high frequency response of the radio receiver and thereby render noise less audible. This is accomplished by means of the semi-conductor amplifier device 92 having an emitter 94, collector 96 and base 98. The base 98 is connected directly with the arm 76 of the potentiometer while the collector 96 is connected to receive a negative operating bias from the voltage drop appearing across resistor 100. Resistor 100 is, in turn, connected through resistor 102 to AGC terminal 90 of the receiver so that the voltage drop across resistor 100 will increase as the signal intensity increases.

In accordance with the arrangement shown and described in Fig. 2, a capacitor 104 is connected in series with resistors 106 and 108 between the base 98 and circuit ground. The emitter 94 of the transistor is connected between the junction of capacitor 104 and resistor 106. Resistor 108 is of a value which increases the high frequency response of the circuit as discussed above. As the received signal becomes greater in intensity, the collector potential applied to the collector 96 becomes greater due to a larger developed automatic gain control potential. This increases the gain of the transistor 92 thereby reducing the effectiveness of the capacitor 104 in its shunting action across the input to the audio frequency amplifier 78. As the received signal decreases in intensity, the gain of transistor 92 is reduced and capacitor 104 becomes more effective thereby reducing the high frequency audio response of the receiver. Thus, under low signal intensity conditions, noise will be less objectionable.

The present invention may be also applied to a conventional television receiver circuit for the purpose of increasing the time constant of the automatic gain control circuit under conditions of lower signal strength. This makes the receiver more immune to noise. The television receiver shown in Fig. 3 comprises conventional elements shown in block form. Block 110 contains a conventional R. F. amplifier, mixer, oscillator, and intermediate frequency amplifier, the output of which is applied to a video detector 112. Video signal from the detector 112 is applied to the video amplifier 116 whose output signal is, in turn, connected to a kinescope 118. Deflection of the electron beam within the kinescope 118 is provided by the deflection yoke 120 driven by the sync and deflection circuits 122. Demodulated video signal is applied to the sync and deflection circuits 122 from the detector 112. A standard automatic gain control circuit 124 has been provided for developing a suitable potential at terminal 126 for application to the AGC input terminal 128 of block 110. A transistor 130 has its base 132 connected with the AGC input terminal 128 whereas the emitter 134 and collector 136 are connected with a bias potential source 138 and a resistance-capacitance arrangement 140 of the type shown in Fig. 1.

In the operation of the arrangement shown in Fig. 3, an increase in received signal strength will result in a more negative automatic gain control potential at terminal 136. This will cause the base 132 of the transistor 130 to swing in negative direction with respect to circuit ground thereby increasing the emitter base bias current of the transistor and increasing the gain thereof. As described in connection with Fig. 1, this will reduce the effectiveness of the capacitor 144 as seen at terminal 126 and decrease the time constant of the automatic gain control circuit. As the received signal intensity is reduced is reduced, the developed AGC potential at terminal 136 becomes less negative thereby reducing the gain of the transistor 130 and permitting the capacitor 144 to become more effective in increasing the time constant of the AGC circuit.

Having thus described our invention, what is claimed is:

In a television signal receiving apparatus the combination of: means for receiving and demodulating modulated radio frequency signals to produce video frequency signals, said means including an automatic gain control potential acceptance terminal means; an automatic gain control circuit operatively coupled with said receiving means responsive to received signals to develop an automatic gain control potential; means operatively coupling said automatic gain control circuit with said gain control potential acceptance terminal means to operatively apply said developed automatic gain control potential in stabilizing relation to said receiving means to reduce amplitude variations in demodulated video frequency signals as a result of variations in the intensity of received radio frequency signals; time constant means included in said automatic gain control circuit and substantially in shunt with said coupling means to reduce the response speed of said automatic gain control circuit; a capacitance means and resistance means connected in series with one another to form a combination; means connecting said combination in shunt with said time constant means in such relation thereto as to increase the time constant value thereof by an amount depending upon the effective value of capacitance appearing across the terminals of said combination, said combination being further connected such that said automatic gain control potential appears at least in part across said combination; a transistor amplifier device having a base electrode, collector electrode and emitter electrode; means connecting said capacitance means between said base electrode and said emitter electrode; means direct current connecting the extremity of said resistance means remote from said capacitance means with said collector electrode to form a collector-emitter current path; power supply means operatively connected in said collector-emitter path for rendering said transistor operative for power amplification with a power gain determined by the value of automatic gain control potential appearing across said combination such that the effective value of capacitance presented by said combination and hence the time constant of said automatic gain control circuit is rendered a function of the value of developed automatic gain control potential.

References Cited in the file of this patent

UNITED STATES PATENTS

| | | |
|---|---|---|
| 2,318,075 | Hollingsworth | May 4, 1943 |
| 2,570,939 | Goodrich | Oct. 9, 1951 |
| 2,606,971 | Scott | Aug. 12, 1952 |
| 2,691,106 | Woodbury | Oct. 5, 1954 |
| 2,714,187 | Goodrich | July 26, 1955 |
| 2,733,415 | Bangert | Jan. 31, 1956 |